United States Patent
Chou et al.

(10) Patent No.: US 7,535,982 B2
(45) Date of Patent: May 19, 2009

(54) METHOD AND APPARATUS FOR ADJUSTING PHASE OF SAMPLING FREQUENCY OF ADC

(75) Inventors: Yu-Pin Chou, Miao-Li Hsien (TW); An-Shih Lee, Hsin-Chu Hsien (TW); Hsien-Chun Chang, Chi-Lung (TW)

(73) Assignee: Realtek Semiconductor Corp., Hsin-Chu (TW)

( * ) Notice: Subject to any disclaimer, the term of this patent is extended or adjusted under 35 U.S.C. 154(b) by 737 days.

(21) Appl. No.: 11/160,516

(22) Filed: Jun. 27, 2005

(65) Prior Publication Data

US 2006/0056558 A1 Mar. 16, 2006

(30) Foreign Application Priority Data

Sep. 15, 2004 (TW) .............................. 93127914 A

(51) Int. Cl.
*H04L 7/00* (2006.01)
(52) U.S. Cl. .................. 375/355; 375/344; 375/371; 348/537; 348/547; 348/572; 341/116; 341/126; 341/142; 341/155
(58) Field of Classification Search ................ 375/354, 375/355, 371, 344; 455/182.1, 182.2, 192.1, 455/192.2; 341/108, 111, 112, 116, 118, 341/122, 126, 142, 155; 348/536, 537, 547, 348/572, 573
See application file for complete search history.

(56) References Cited

U.S. PATENT DOCUMENTS

| 6,184,939 | B1 * | 2/2001 | Wang et al. | 348/625 |
| 6,268,848 | B1 * | 7/2001 | Eglit | 345/213 |
| 6,313,881 | B1 * | 11/2001 | Reinhart et al. | 348/572 |
| 6,700,570 | B2 * | 3/2004 | Tachibana et al. | 345/213 |
| 7,236,163 | B2 * | 6/2007 | Yoo | 345/213 |

* cited by examiner

*Primary Examiner*—Dac V Ha
(74) *Attorney, Agent, or Firm*—Winston Hsu

(57) ABSTRACT

A method for adjusting a phase of a sampling frequency of ADC is disclosed. The method includes converting an analog signal into a first digital signal according to a first phase of the sampling frequency during a first time interval; calculating a first value according to the first digital signal; converting the analog signal into a second digital signal according to a second phase of the sampling frequency during a second time interval; calculating a second value according to the second digital signal; and adjusting the phase of the sampling frequency according to the first value and the second value.

25 Claims, 4 Drawing Sheets

METHOD AND APPARATUS FOR ADJUSTING PHASE OF SAMPLING FREQUENCY OF ADC

BACKGROUND OF THE INVENTION

1. Field of the Invention

The present invention relates to an ADC, and more particularly, to a sampling frequency of the ADC.

2. Description of the Prior Art

For an ADC, a correct phase of a sampling frequency of the ADC is very important. Auto phase setting is implemented to automatically adjust phases of a sampling frequency of an ADC in an electronic device, such as a liquid crystal display (LCD).

FIG. 1 is a timing diagram of a conventional phase setting method 100. The conventional method 100 comprises three steps: a phase-setting step, which is implemented to receive an auto phase setting instruction during a zeroth frame $F_0$, a phase-measuring/calculating step, which is implemented to sample the image frame according to a zeroth phase $P_0$ of a sampling frequency and to calculate characteristic values of the image frame corresponding to the zeroth phase $P_0$ based on a predetermined algorithm during a first frame $F_1$, and a phase characteristics-reading step, which is implemented to read (output) the characteristic values of the image frame corresponding to the zeroth phase $P_0$ during a second frame $F_2$. In the steps described above, any time interval between any two consecutive frames, such as the zeroth frame $F_0$ and the first frame $F_1$, is equal in length to a time interval between any two consecutive vertical synchronization signals $V_{sync}$ of the image frame.

The conventional method 100 does not stop executing the above three steps on the image frame until acquiring the characteristic values of all the phases of the sampling frequency. By the analysis of the characteristic values (for example, determining the largest and the smallest characteristic values), an optimum sampling point is obtained and the phase adjustment, to use the optimum sampling point as the sampling point of the ADC, in the sampling frequency is completed.

According to the above, if the sampling frequency in the exemplary LCD includes N phases, the conventional method 100 has to take as long as 3N times the length of one frame to acquire the characteristic values corresponding to the N phases.

In general, the sampling frequency includes 32 phases, and a user has to wait about three to four seconds to see the set image frame IF set by the conventional method 100 to be displayed again on the LCD.

SUMMARY OF THE INVENTION

It is therefore a primary objective of the claimed invention to provide a method for adjusting a phase of a sampling frequency, so as to overcome the drawbacks of the prior art.

According to the claimed invention, the method is implemented to adjust a phase of a sampling frequency, and the method includes: converting an analog signal into a first digital signal according to a first phase of the sampling frequency during a first time interval; calculating a first value according to the first digital signal; converting the analog signal into a second digital signal according to a second phase of the sampling frequency during a second time interval; calculating a second value according to the second digital signal; and adjusting the phase of the sampling frequency according to the first value and the second value.

These and other objectives of the present invention will no doubt become obvious to those of ordinary skill in the art after reading the following detailed description of the preferred embodiment that is illustrated in the various figures and drawings.

DETAILED DESCRIPTION

The auto phase setting method of the present invention, through the installation of a state machine, executes the three auto phase setting steps (the phase-setting step, the phase-measuring/-calculating step, and the phase' characteristics-reading step) on a plurality of phases corresponding to the image frame at the same time (the frame $F_0$ for example).

Figure 1:
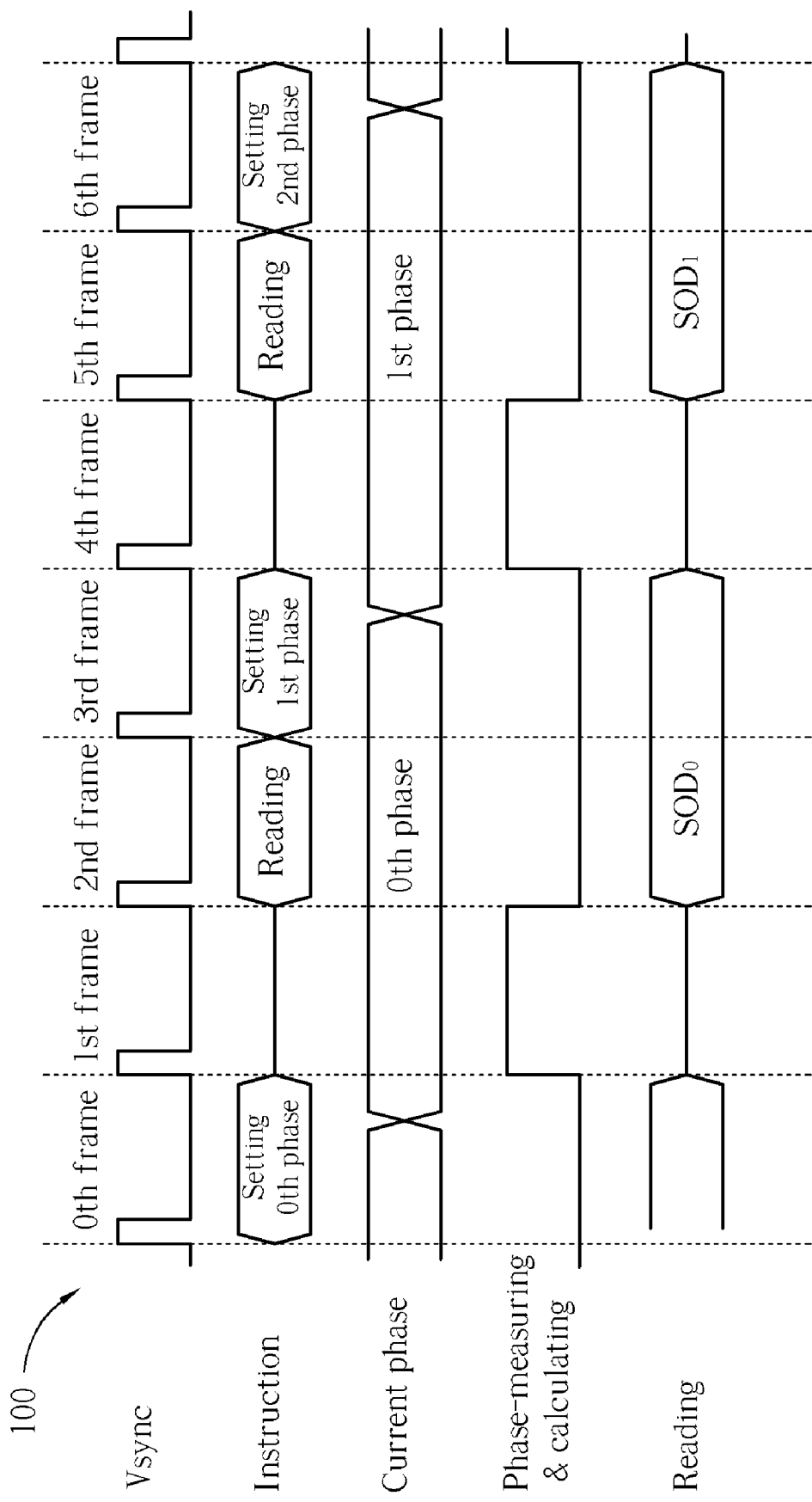
FIG. 1 shows a timing diagram of a conventional phase setting method.
Figure 2:
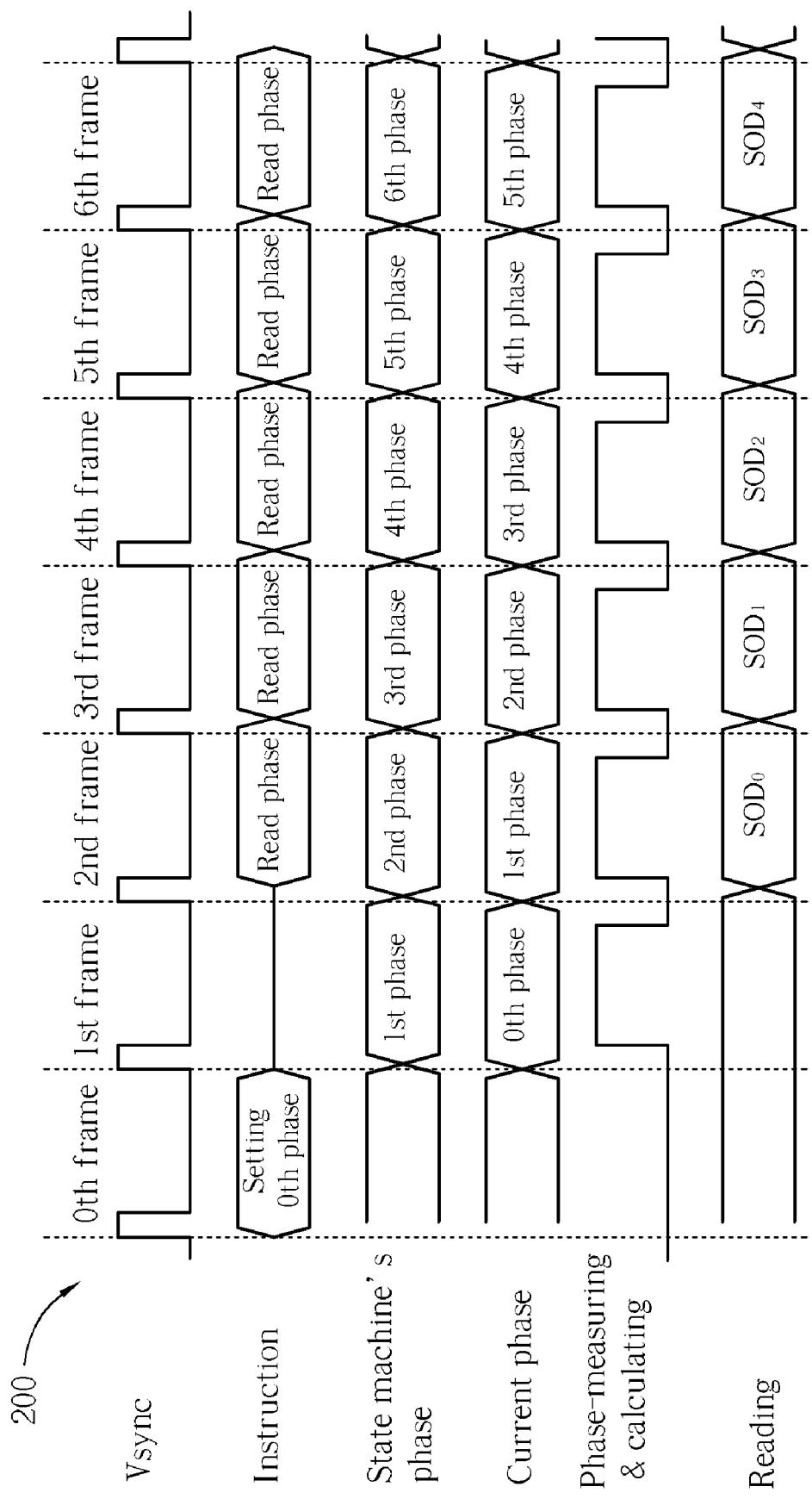
FIG. 2 shows a timing diagram of an auto phase setting method of the present invention.

Please refer to FIG. 2, the auto phase setting method 200 receives the auto phase setting instruction and executes the auto phase setting step during a zeroth frame $F_0$—a zeroth phase setting step. During a first frame $F_1$, the ADC transforms the image frame according to a zeroth phase $P_0$ of the sampling frequency into a first digital signal corresponding to the zero phase $P_0$, and generates a first characteristic value corresponding to the zeroth phase $P_0$ by calculating the first digital signal based on a predetermined algorithm. Moreover, before the ending of the first frame $F_1$, a state machine gives an instruction to shift phase automatically-the zeroth phase-measuring & calculating step and the first phase-setting step. The auto phase setting method 200 then outputs the first characteristic value to a register during a second frame $F_2$, which is right next to the first frame $F_1$. At the same time, the ADC transforms the image frame according to the first phase $P_1$ of the sampling frequency into a second digital signal corresponding to the first phase $P_1$, and generates a second characteristic value corresponding to the first phase $P_1$ by calculating the second digital signal based on the predetermined algorithm as well. Similarly, before the ending of the second frame $F_2$, a state machine gives the instruction to shift phase automatically the zeroth phase' characteristics-reading step, the first phase-measuring & calculating step, and the second phase-setting step.

The auto phase setting method 200 does not stop executing the above three steps on the image frame until acquiring the characteristic values of all the phases of the sampling frequency. In the preferred embodiment, the largest characteristic value of the calculated characteristic values corresponds to an optimum phase $P_{opt}$, the optimum sampling point, of the image frame.

In such a scenario described above, the auto phase setting method 200 can take as less as (N+2) times the length of one frame to read the characteristic values of the N phases corresponding to the image frame.

In the auto phase setting method 200, the image frame is a part of a video signal, and a time interval between the zeroth frame $F_0$ and the first frame $F_1$ is equal in length to a time interval, i.e. the time interval of a frame as shown in FIG. 2, between any two consecutive vertical synchronization signals $V_{sync}$ corresponding to the video signal. In conclusion, the time interval of the zeroth frame $F_0$ is substantially equal to the time interval of the first frame $F_1$. The first digital signal, which is output from the ADC by the transformation in the image frame according to the zeroth phase $P_0$ of the sampling frequency during the first frame $F_1$, relates the pixel data of a first video frame of the video signal. Similarly, the second digital signal relates to the pixel data of a second video frame of the video signal.

In the auto phase setting method 200, the predetermined algorithm is a sum of difference (SOD) algorithm, which sums the differences between any two consecutive pixels during a unit time period and forms the characteristic values. The unit time period can be the time interval of any two consecutive vertical synchronization signals $V_{sync}$.

Figure 3:
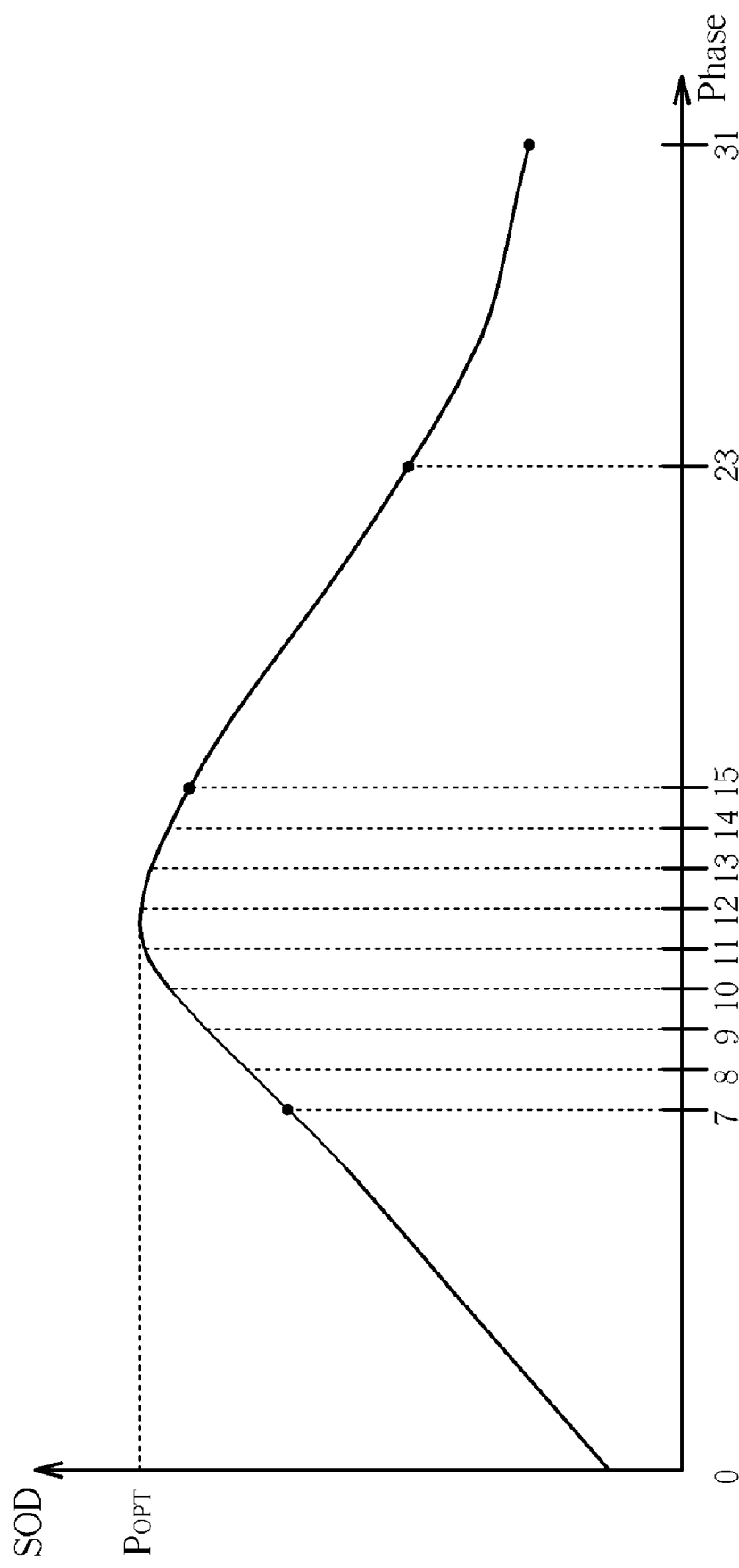
FIG. 3 shows a relation diagram of phases and SOD values according to the present invention.

Please refer to FIG. 3, which is a relation diagram of 32 (N=32) phases and 32 characteristic values corresponding to the phases calculated through the use of the SOD algorithm in the auto phase setting method 200 according to the present invention. An ordinate of the relation diagram represents the 32 phases, while an abscissa the 32 characteristic values.

In a second embodiment, the auto phase setting method 200 first calculates a possible area, within which the optimum phase $P_{opt}$ is likely fallen, according to a seventh, a fifteenth, a twenty-third, and a thirty-first phases $P_7$, $P_{15}$, $P_{23}$, and $P_{31}$. As shown in FIG. 3, the possible area ranges between the seventh phase $P_7$ and the fifteenth phase $P_{15}$, which corresponds to two larger characteristic values of the four characteristic values. Next, the auto phase setting method 200 executes the above steps on the phases from $P_8$ to $P_{14}$, all of which are located within the possible area, to calculate the optimum phase $P_{opt}$. In summary, the auto phase setting method 200 divides the 32 phases into four phase regions, determines which phase region is the possible area, and finds out the optimum phase $P_{opt}$ in the possible area. In contrast to the prior art, which has to execute the auto phase setting steps as many as 32 times to get the optimum phase $P_{opt}$, the auto phase setting method 200 only has to execute the auto phase setting steps eleven times (4+7).

As described previously, when executing the phase-measuring & -calculating step, the auto phase setting method 100 has to measure a large number of phases. On the contrary, the auto phase setting method 200 can calculate the possible area, within which the optimum phase $P_{opt}$ corresponding to the image frame is likely fallen, according to a finite number of phases, and finds out the optimum phase $P_{opt}$ in the possible area.

In an embodiment, the auto phase setting method 200 calculates a part of pixel data of the image frame. For example, the auto phase setting method 200 calculates the upper half part or the odd-numbered horizontal scan lines of the image frame. Therefore, even with a slow and low-cost logic, the auto phase setting method 200 can still execute the above steps and get the optimum phase $P_{opt}$.

In an embodiment, the state machine can be implemented by hardware or firmware, or the combination of both.

Figure 4:
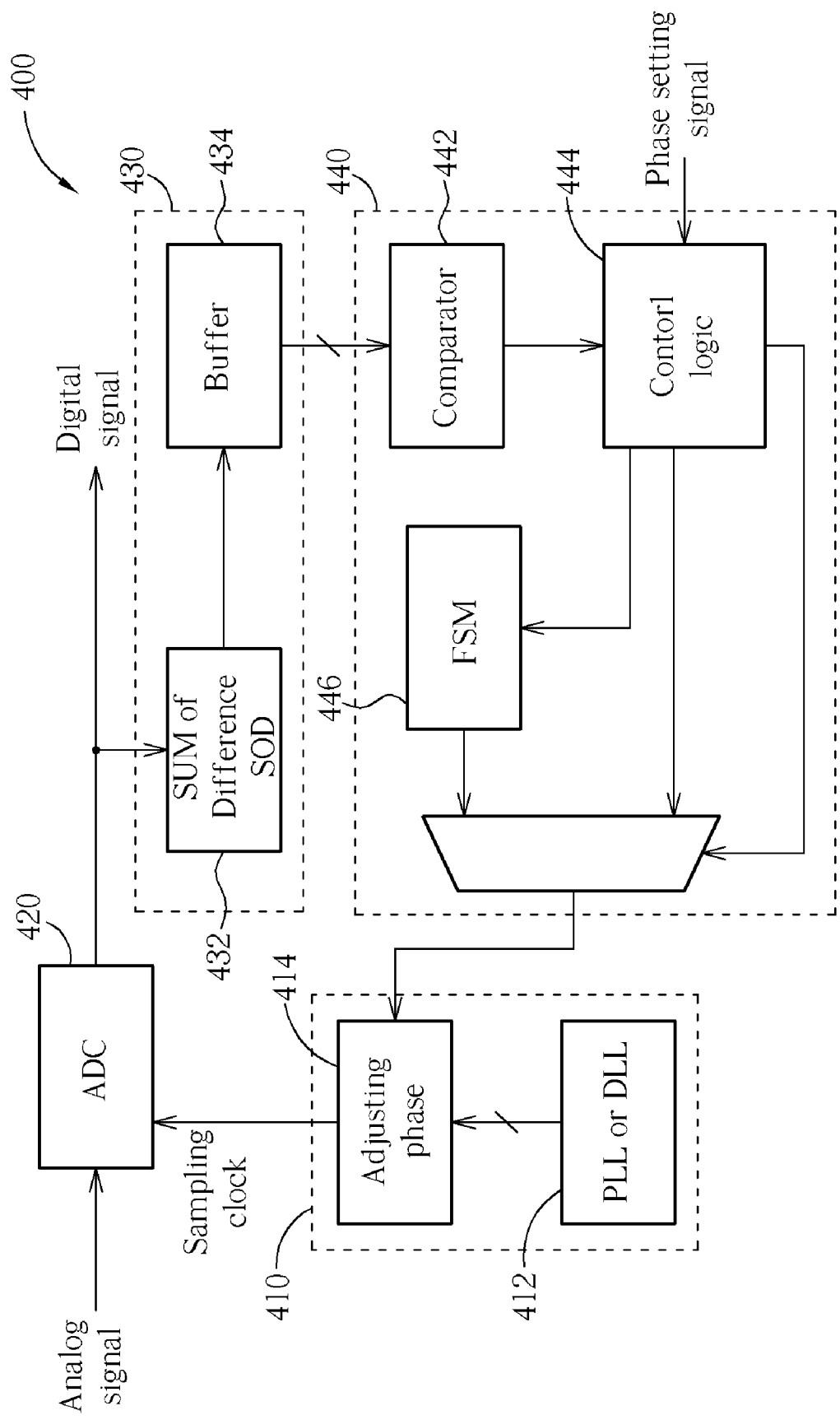
FIG. 4 illustrates a diagram of an embodiment of a phase adjusting apparatus according to the present invention.

Please refer to FIG. 4, an adjusting phase apparatus 400 of the invention is disclosed. The apparatus 400 is coupled to an ADC 420 and comprises a sampling clock generator 410, a calculating circuit 430, and a control circuit 440.

The sampling clock generator 410 generates a sampling clock according to a control signal from the control circuit 440 and output the sampling clock into the ADC 420. The ADC 420 converts an analog signal into a plurality of digital signals according to a plurality of phase regions of the sampling clock, respectively. The calculating circuit 430 generates a plurality of characteristic values according to the plurality of digital signals, respectively. The control circuit 440 groups the phases of the sampling clock into the plurality of phase regions, and determines one of the phase regions as an eligible phase region of the sampling clock according to the characteristic values.

In a preferred embodiment, the adjusting phase apparatus 400 further determines one of phases of the eligible phase region as an eligible phase of the sampling clock.

In an embodiment, the sampling clock generator 410 comprises a phase adjustor 414 and a multi-phase clock generator 412 which generates a plurality of multi-phase clock signals. The multi-phase clock generator 412 can be Phase-Locked-Loop (PLL) or Delayed-Locked-Loop (DLL). The phase adjustor 414 can be a multiplexer.

In an embodiment, the calculating circuit 430 comprises a sum of difference (SOD) logic 432 for using SOD algorithm to produce a plurality of SOD values, and a buffer 434 for storing the SOD values.

In an embodiment, the control circuit 440 comprises a comparator 442 for comparing the SOD values to output a comparison result, and control logic 444 for outputting the control signal according to the comparison result and outputting the control signal into the sampling clock generator 410.

In a preferred embodiment, the control circuit 440 further comprises a state machine 446 for automatically setting a next phase region of the sampling clock when the control circuit 440 receives the corresponding SOD value.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for adjusting a phase of a sampling frequency of an analog-to-digital converter (ADC), comprising:
    converting using the ADC an analog signal into a first digital signal according to a first phase of the sampling frequency during a first time interval;
    calculating a first value according to the first digital signal based on a predetermined algorithm;
    converting the analog signal into a second digital signal according to a second phase of the sampling frequency during a second time interval;
    calculating a second value according to the second digital signal based on the predetermined algorithm; and
    adjusting the phase of the sampling frequency according to the first value and the second value;
    wherein the analog signal is a video signal, and the first time interval, and the second time interval as well, is a time interval between any two consecutive vertical synchronization signals of the video signal.

2. The method of claim 1, wherein the first time interval, and the second time interval as well, is substantially equal to a time interval of a frame of the video signal.

3. The method of claim 1, wherein the analog signal is a video signal, the first digital signal is pixel data of a first frame of the video signal, and the second digital signal is pixel data of a second frame of the video signal.

4. The method of claim 1, wherein the first phase and the second phase have between them at least a third phase.

5. The method of claim 1, wherein the predetermined algorithm is a sum of difference (SOD) algorithm.

6. The method of claim 1 further comprising:
    receiving the first value and automatically setting a next phase of the sampling frequency.

7. A method for adjusting a phase of a sampling frequency, comprising:
grouping a plurality of phases of the sampling frequency into a first phase region and a second phase region;
converting using an analog-to-digital converter (ADC) an analog signal into a first digital signal according to a first phase of the first phase region;
generating a first value according to the first digital signals;
converting the analog receiving signal into a second digital signal according to a second phase of the second phase region;
generating a second value according to the second digital signals; and
determining one of the first phase region and the second phase region as an eligible phase region of the sampling frequency according to the first value and the second value.

8. The method of claim 7 further comprising:
converting the analog signal into a plurality of third digital signals according to the phases in the eligible phase region;
generating a plurality of third values according to the third digital signals; and
determining an eligible phase of the eligible phase region according to the third values.

9. The method of claim 7, wherein the analog signal is a video signal.

10. The method of claim 9, wherein the first digital signal is pixel data of a first frame of the video signal, and the second digital signal is pixel data of a second frame of the video signal.

11. The method of claim 7, wherein the first value is calculated according to the first digital signals based on a sum of difference (SOD) algorithm.

12. The method of claim 7 further comprising:
automatically setting a next phase region of the sampling frequency when the first value is generated.

13. The method of claim 12, wherein the step of automatically setting is realized by hardware, firmware, or the combination of both.

14. An apparatus for adjusting a phase of a sampling signal of an analog-to-digital converter (ADC) which converts an analog signal into a first digital signal according to a first phase of a first phase region of the sampling signal, and converts the analog signal into a second digital signal according to a second phase of a second phase region of the sampling signal, the apparatus comprising:
a sampling signal generator, coupled to the ADC, to generate the sampling signal according to a control signal;
a calculating circuit, coupled to the ADC, to generate a first value and a second value according to the first and the second digital signals, respectively; and
a control circuit, coupled to the calculating circuit and the sampling signal generator, to determine one of the first phase region and the second phase region as an eligible phase region of the sampling signal according to the first value and the second value.

15. The apparatus of claim 14, wherein the analog signal is a video signal.

16. The apparatus of claim 15, wherein the first digital signal is pixel data of a first frame of the video signal, and the second digital signal is pixel data of a second frame of the video signal.

17. The apparatus of claim 14, wherein the calculating circuit uses a sum of difference (SOD) algorithm to generate the first value and the second value.

18. The apparatus of claim 14, wherein the control circuit comprises:
a state machine to automatically set a next phase region of the sampling signal when the control circuit receives the first value.

19. The apparatus of claim 14, wherein the sampling signal generator comprises:
a multi-phase signal generator for generating a plurality of multi-phase signals; and
a phase adjustor for selecting one of the plurality of multi-phase signals as the sampling signal.

20. A method for adjusting a phase of a sampling frequency of an analog-to-digital converter (ADC), comprising:
converting using the ADC an analog signal into a first digital signal according to a first phase of the sampling frequency during a first time interval;
calculating a first value according to the first digital signal based on a predetermined algorithm;
converting the analog signal into a second digital signal according to a second phase of the sampling frequency during a second time interval;
calculating a second value according to the second digital signal based on the predetermined algorithm; and
adjusting the phase of the sampling frequency according to the first value and the second value;
wherein the analog signal is a video signal, the first digital signal is pixel data of a first frame of the video signal, and the second digital signal is pixel data of a second frame of the video signal.

21. The method of claim 20, wherein the analog signal is a video signal, and the first time interval, and the second time interval as well, is a time interval between any two consecutive vertical synchronization signals of the video signal.

22. The method of claim 20, wherein the first time interval, and the second time interval as well, is substantially equal to a time interval of a frame of the video signal.

23. The method of claim 20, wherein the first phase and the second phase have between them at least a third phase.

24. The method of claim 20, wherein the predetermined algorithm is a sum of difference (SOD) algorithm.

25. The method of claim 20 further comprising:
receiving the first value and automatically setting a next phase of the sampling frequency.

* * * * *